(12) United States Patent
Iki

(10) Patent No.: US 7,652,293 B2
(45) Date of Patent: Jan. 26, 2010

(54) ELECTRO-OPTICAL DEVICE AND ELECTRONIC APPARATUS

(75) Inventor: Takunori Iki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 139 days.

(21) Appl. No.: 11/900,943

(22) Filed: Sep. 14, 2007

(65) Prior Publication Data

US 2008/0067521 A1    Mar. 20, 2008

(30) Foreign Application Priority Data

Sep. 15, 2006  (JP) ............... 2006-250398
Aug. 9, 2007   (JP) ............... 2007-207507

(51) Int. Cl.
*H01L 27/14*   (2006.01)
(52) U.S. Cl. ........................ 257/72; 257/213
(58) Field of Classification Search ............ 257/72, 257/213, E29.003
See application file for complete search history.

(56) References Cited

U.S. PATENT DOCUMENTS

| | | | | |
|---|---|---|---|---|
| 5,414,547 A | * | 5/1995 | Matsuo et al. | 349/44 |
| 6,091,467 A | * | 7/2000 | Kubo et al. | 349/44 |
| 6,197,458 B1 | * | 3/2001 | Kato | 430/7 |
| 6,646,288 B2 | * | 11/2003 | Yamazaki et al. | 257/72 |
| 6,809,338 B2 | * | 10/2004 | Murade | 257/72 |

FOREIGN PATENT DOCUMENTS

| JP | 09-033944 A | | 2/1997 |
|---|---|---|---|
| JP | 2001-215517 A | | 8/2001 |
| JP | 2002-110993 A | | 4/2002 |
| JP | 2002-221737 A | | 8/2002 |
| JP | 2002221737 A | * | 8/2002 |
| JP | 2003-337553 A | | 11/2003 |
| JP | 2004-205974 A | | 7/2004 |
| JP | 2004-336019 A | | 11/2004 |
| JP | 2005-227626 A | | 8/2005 |
| JP | 2005227626 A | * | 8/2005 |
| JP | 2006-003920 A | | 1/2006 |

* cited by examiner

*Primary Examiner*—Leonardo Andújar
*Assistant Examiner*—Jordan Klein
(74) *Attorney, Agent, or Firm*—AdvantEdge Law Group, LLC

(57) ABSTRACT

An electro-optical device in which a plurality of thin films are laminated on a substrate and a transistor is formed by a part of the plurality of laminated thin films includes a light-shielding insulating layer that forms a part of the plurality of thin films and is laminated on the substrate so as to cover at least a part of a semiconductor layer of the transistor in plan view.

5 Claims, 9 Drawing Sheets

ELECTRO-OPTICAL DEVICE AND ELECTRONIC APPARATUS

BACKGROUND

1. Technical Field

The present invention relates to an electro-optical device, in which a plurality of thin films are laminated on a substrate and transistors are formed by a part of the plurality of laminated thin films, and an electronic apparatus.

2. Related Art

As is well known, an electro-optical device, for example, a light-transmissive liquid crystal device is configured such that liquid crystal is interposed between two substrates, such as a glass substrate, a quartz substrate, and a silicon substrate. In addition, for example, pixel electrodes and switching elements, such as thin film transistors, are arrayed in a matrix on one of the substrates and counter electrodes are arrayed on the other substrate. Image display is realized by changing an optical characteristic of a liquid crystal layer interposed between both the substrates in response to an image signal.

Furthermore, an element substrate on which transistors are arrayed and a counter substrate disposed opposite the element substrate are separately manufactured. The element substrate and the counter substrate are formed by laminating a semiconductor thin film, an insulating thin film, or a conductive thin film having a predetermined pattern on a quartz substrate, for example. That is, the element substrate and the counter substrate are formed by repeating processes of forming various kinds of films and a photolithographic process for respective layers.

In this case, a plurality of transistors provided for respective pixel electrodes are formed at intersections of data lines, which are used to supply image signals to pixel electrodes, and scanning lines, which are used to supply ON signals to transistors, in a display region of a liquid crystal device.

In addition, a transistor is configured to include: a semiconductor layer having an LDD structure including a channel region, a source region, and a drain region; a gate insulating layer laminated on the semiconductor layer so as to cover the semiconductor layer in plan view; and a gate electrode laminated on the gate insulating layer so as to be opposite to the channel region.

In this case, when light is incident on the channel region of the semiconductor layer of the transistor, the transistor malfunctions and display unevenness, crosstalk, and flickering resulting from an off-leakage current occur in the liquid crystal device. In addition, a display contrast decreases.

In view of the above problems, a configuration of a liquid crystal device capable of preventing light from being incident on a channel region of a semiconductor layer by providing a light shielding layer, which covers a lower side of the semiconductor layer in plan view, below the semiconductor layer and providing a light shielding layer, which covers an upper side of the semiconductor layer in plan view, above the semiconductor layer is known. For example, JP-A-2003-337553 discloses such configuration.

The liquid crystal device disclosed in JP-A-2003-337553 has a configuration in which scanning lines serve as a light shielding layer that covers a lower side of a semiconductor layer in plan view and electrodes of storage capacitors that hold voltages of pixel electrodes and data lines serve as a light shielding layer that covers an upper side of the semiconductor layer in plan view.

Furthermore, the liquid crystal device disclosed in JP-A-2003-337553 has a configuration in which extended portions for defining opening regions of pixels are provided for the electrodes of the storage capacitors, which serve as a light shielding layer that covers the upper side of the semiconductor layer, at intersections between the data lines and the scanning lines where the semiconductor layer is formed. In other words, a technique of reliably blocking light, which is incident on the channel region of the semiconductor layer in the perpendicular or oblique direction from an upper side, without decreasing an aperture ratio of each pixel by adopting the configuration in which a wide light shielding layer is formed at the intersections is disclosed in JP-A-2003-337553.

However, in the configuration of the liquid crystal device disclosed in JP-A-2003-337553, a light-transmissive insulating layer having a predetermined thickness is laminated between a semiconductor layer and an upper light shielding layer and between the semiconductor layer and a lower light shielding layer. That is, since the semiconductor layer is laminated so as to be apart from the upper and lower light shielding layers by a predetermined distance, it was not sufficient to reliably block light from being incident on the channel region of the semiconductor layer only with the upper and lower light shielding layers.

In addition, a gate electrode is formed only on the channel region of the semiconductor layer. Accordingly, a step difference occurs in a region where the gate electrode is formed and other portions of the semiconductor layer.

In addition, a data line is electrically connected to a source region of the semiconductor layer. For this reason, when a high dielectric constant layer that forms a light shielding layer is formed on the source region, coupling between a data line and the light shielding layer occurs. As a result, an electrical characteristic deteriorates.

SUMMARY

An advantage of some aspects of the invention is that it provides an electronic apparatus and an electro-optical device having a configuration capable of reliably preventing light from being incident on a channel region of a semiconductor layer of a transistor, reliably preventing a transistor from malfunctioning and display unevenness, crosstalk, and flickering resulting from an off-leakage current from occurring, reliably preventing a display contrast from decreasing, suppressing occurrence of a step difference on the semiconductor layer, and preventing an electrical characteristic from deteriorating due to coupling between data lines and a light shielding layer.

According to an aspect of the invention, an electro-optical device in which a plurality of thin films are laminated on a substrate and a transistor is formed by a part of the plurality of laminated thin films includes: a light-shielding insulating layer that forms a part of the plurality of thin films and is laminated on the substrate so as to cover at least a part of a semiconductor layer of the transistor in plan view.

In the electro-optical device described above, preferably, the semiconductor layer has an LDD structure including a channel region, a source region, and a drain region, and the light-shielding insulating layer is laminated in the island shape on the substrate so as to cover at least LDD regions of the source and drain regions of the semiconductor layer in plan view.

According to the electro-optical device described above, it is possible to block light from being incident on the channel region of the semiconductor layer by means of the light-shielding insulating layer that covers at least a part of the semiconductor layer, specifically, an LDD region in plan view, which cannot be blocked by a light shielding layer or a layer serving as a light shielding layer provided in the electro-optical device. That is, since it is possible to prevent light from being incident on the channel region, it is possible to provide an electro-optical device having a configuration capable of preventing occurrence of display unevenness, crosstalk, and flickering resulting from an off-leakage current generated when light is incident on the channel region or preventing a display contrast from decreasing.

Furthermore, in the electro-optical device described above, preferably, the light-shielding insulating layer is laminated in the island shape on the substrate so as to cover the entire semiconductor layer in plan view.

According to the electro-optical device described above, it is possible to block light from being incident on the channel region of the semiconductor layer by means of the light-shielding insulating layer that covers the entire semiconductor layer in plan view, which cannot be blocked by a light shielding layer or a layer serving as a light shielding layer provided in the electro-optical device. That is, since it is possible to prevent light from being incident on the channel region, it is possible to provide an electro-optical device having a configuration capable of preventing occurrence of display unevenness, crosstalk, and flickering resulting from an off-leakage current generated when light is incident on the channel region or preventing a display contrast from decreasing.

Furthermore, in the electro-optical device described above, preferably, the light-shielding insulating layer is laminated above the semiconductor layer so as to be adjacent to the semiconductor layer.

According to the electro-optical device described above, it is possible to block light from being incident on the channel region of the semiconductor layer from an upper layer side of the channel region by means of the light-shielding insulating layer that is laminated above the semiconductor layer so as to be adjacent to the semiconductor layer, which cannot be blocked by a light shielding layer or a layer serving as a light shielding layer provided in the electro-optical device. That is, since it is possible to prevent light from being incident on the channel region, it is possible to provide an electro-optical device having a configuration capable of preventing occurrence of display unevenness, crosstalk, and flickering resulting from an off-leakage current generated when light is incident on the channel region or preventing a display contrast from decreasing.

Furthermore, in the electro-optical device described above, preferably, the light-shielding insulating layer is laminated below the semiconductor layer so as to be in contact with or adjacent to the semiconductor layer.

According to the electro-optical device described above, it is possible to block light from being incident on the channel region of the semiconductor layer from a lower layer side of the channel region by means of the light-shielding insulating layer that is laminated below the semiconductor layer so as to be in contact with or adjacent to the semiconductor layer, which cannot be blocked by a light shielding layer or a layer serving as a light shielding layer provided in the electro-optical device. That is, since it is possible to prevent light from being incident on the channel region, it is possible to provide an electro-optical device having a configuration capable of preventing occurrence of display unevenness, crosstalk, and flickering resulting from an off-leakage current generated when light is incident on the channel region or preventing a display contrast from decreasing.

In addition, it is possible to block light from being incident on the channel region from upper and lower layer sides of the channel region by means of the light-shielding insulating layers laminated above and below the semiconductor layer. That is, since it is possible to prevent light from being incident on the channel region of the semiconductor layer, it is possible to provide an electro-optical device having a configuration capable of preventing occurrence of display unevenness, crosstalk, and flickering resulting from an off-leakage current generated when light is incident on the channel region or preventing a display contrast from decreasing.

Furthermore, in the electro-optical device described above, preferably, the light-shielding insulating layer is formed of a high dielectric constant material.

Furthermore, in the electro-optical device described above, preferably, the light-shielding insulating layer is formed of a hafnium oxide or a zirconium oxide.

According to the electro-optical device described above, the light-shielding insulating layer is formed of a hafnium oxide having a transmittance of visible light of about 80% or a zirconium oxide having a transmittance of visible light of about 70%, the hafnium oxide and the zirconium oxide being high dielectric constant materials. As a result, it is possible to provide an electro-optical device having a configuration capable of reliably preventing light from being incident on the channel region of the semiconductor layer.

Furthermore, in the electro-optical device described above, preferably, the transistor includes: the semiconductor layer; a gate insulating layer that is laminated on the semiconductor layer and is formed of a silicon oxide; and a gate electrode laminated on the gate insulating layer so as to be opposite to the channel region. In addition, preferably, the light-shielding insulating layer is formed of a material having a lower transmittance of visible light than the silicon oxide.

According to the electro-optical device described above, the light-shielding insulating layer is formed of a material having a lower transmittance of visible light than the gate insulating layer laminated on the semiconductor layer formed of a silicon oxide having a transmittance of visible light of about 90%. As a result, it is possible to provide an electro-optical device having a configuration capable of reliably preventing light from being incident on the channel region of the semiconductor layer.

In addition, according to another aspect of the invention, there is provided an electronic apparatus including an electro-optical device in which a plurality of thin films are laminated on a substrate and a transistor is formed by a part of the plurality of laminated thin films. In this case, a light-shielding insulating layer that forms a part of the plurality of thin films is laminated on the substrate so as to cover at least a part of a semiconductor layer of the transistor in plan view.

According to the electronic apparatus described above, it is possible to block light from being incident on the channel region of the semiconductor layer by means of the light-shielding insulating layer that covers at least a part of the semiconductor layer, specifically, an LDD region in plan view, which cannot be blocked by a light shielding layer or a layer serving as a light shielding layer provided in the electro-optical device. That is, since it is possible to prevent light from being incident on the channel region, it is possible to provide an electronic apparatus having an electro-optical device having a configuration capable of preventing occurrence of display unevenness, crosstalk, and flickering resulting from an off-leakage current generated when light is incident on the channel region or preventing a display contrast from decreasing.

Furthermore, in the electro-optical device described above, preferably, the light-shielding insulating layer is formed on the semiconductor layer excluding a region where a gate electrode of the transistor is formed.

According to the configuration described above, a step difference between a portion where a gate electrode is formed and other portions is reduced due to the light-shielding insulating layer.

In addition, in the electro-optical device described above, preferably, the semiconductor layer has an LDD structure including a channel region, a source region, and a drain region, and the light-shielding insulating layer is laminated in the island shape on the substrate so as to cover an LDD region of one, which is electrically connected to a pixel electrode, of the source and drain regions of the semiconductor layer in plan view.

According to the configuration described above, since the LDD region that is easily affected by light can be reliably blocked from light, it is possible to effectively prevent an optical leakage from occurring.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. In the embodiments to be described below, electro-optical devices will be described using light-transmissive liquid crystal devices as examples. In addition, the following explanation will be made using an example in which one of a pair of substrates disposed opposite each other in a liquid crystal device is an element substrate (hereinafter, referred to as a TFT substrate) and the other substrate is a counter substrate opposite the TFT substrate.

First Embodiment

Figure 1:
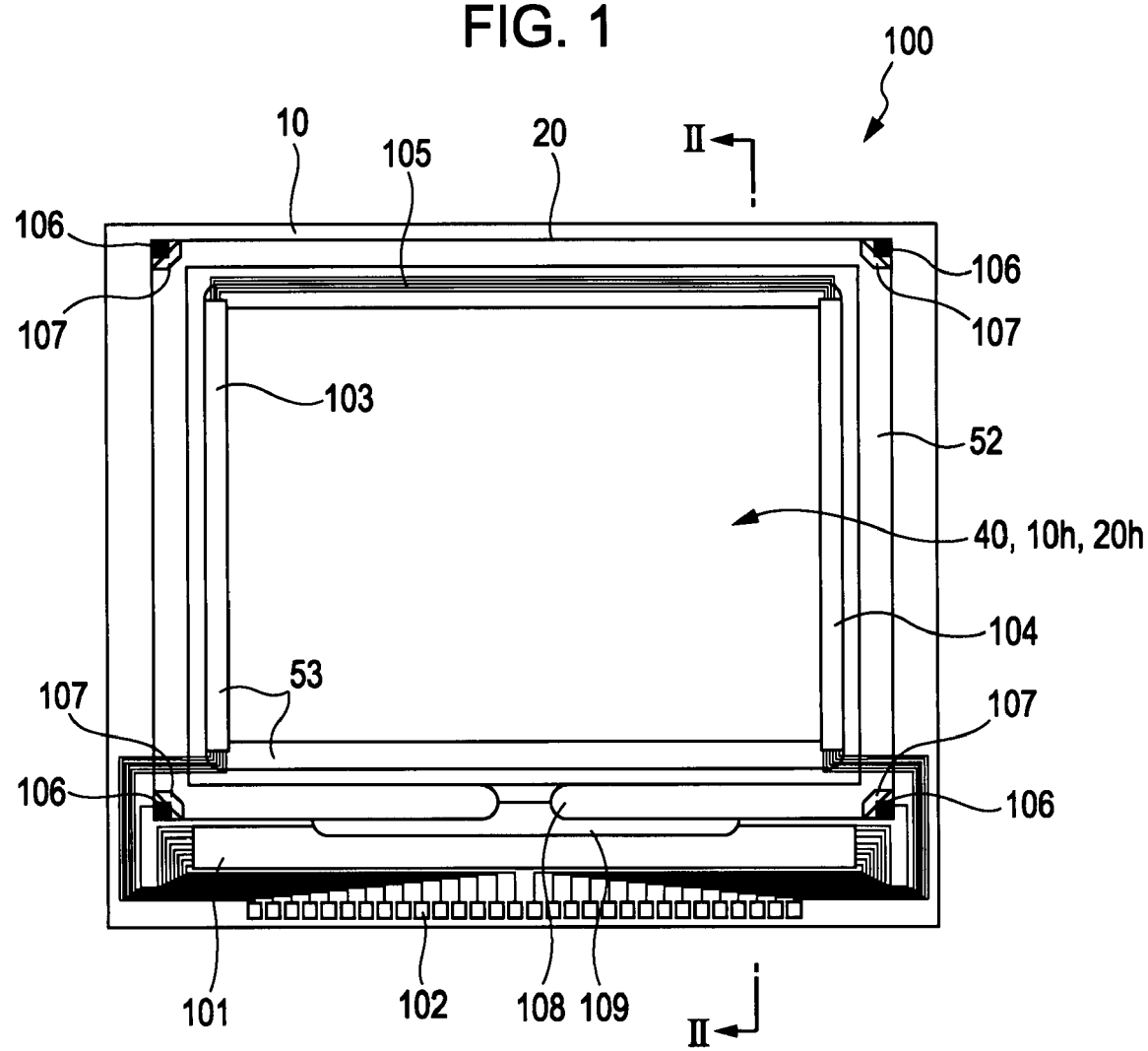
FIG. 1 is a plan view illustrating a liquid crystal device according to a first embodiment.
Figure 2:
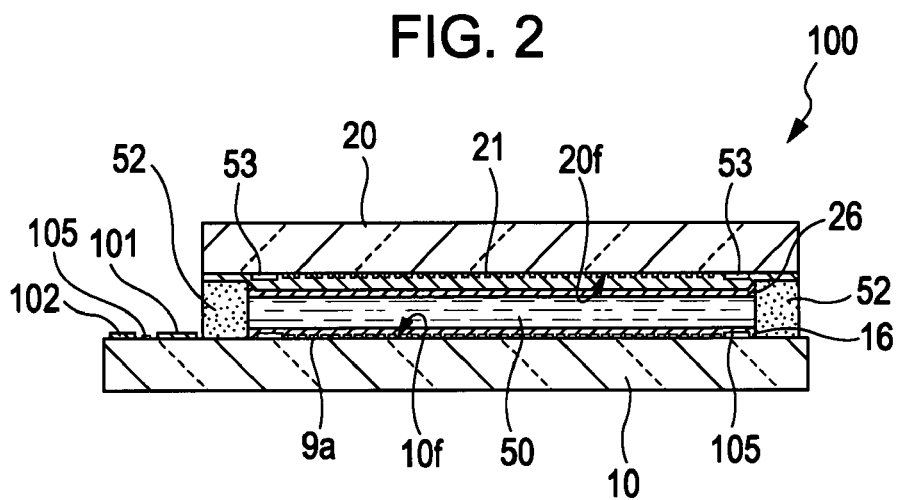
FIG. 2 is a cross-sectional view taken along the line II-II of FIG. 1.
Figure 3:
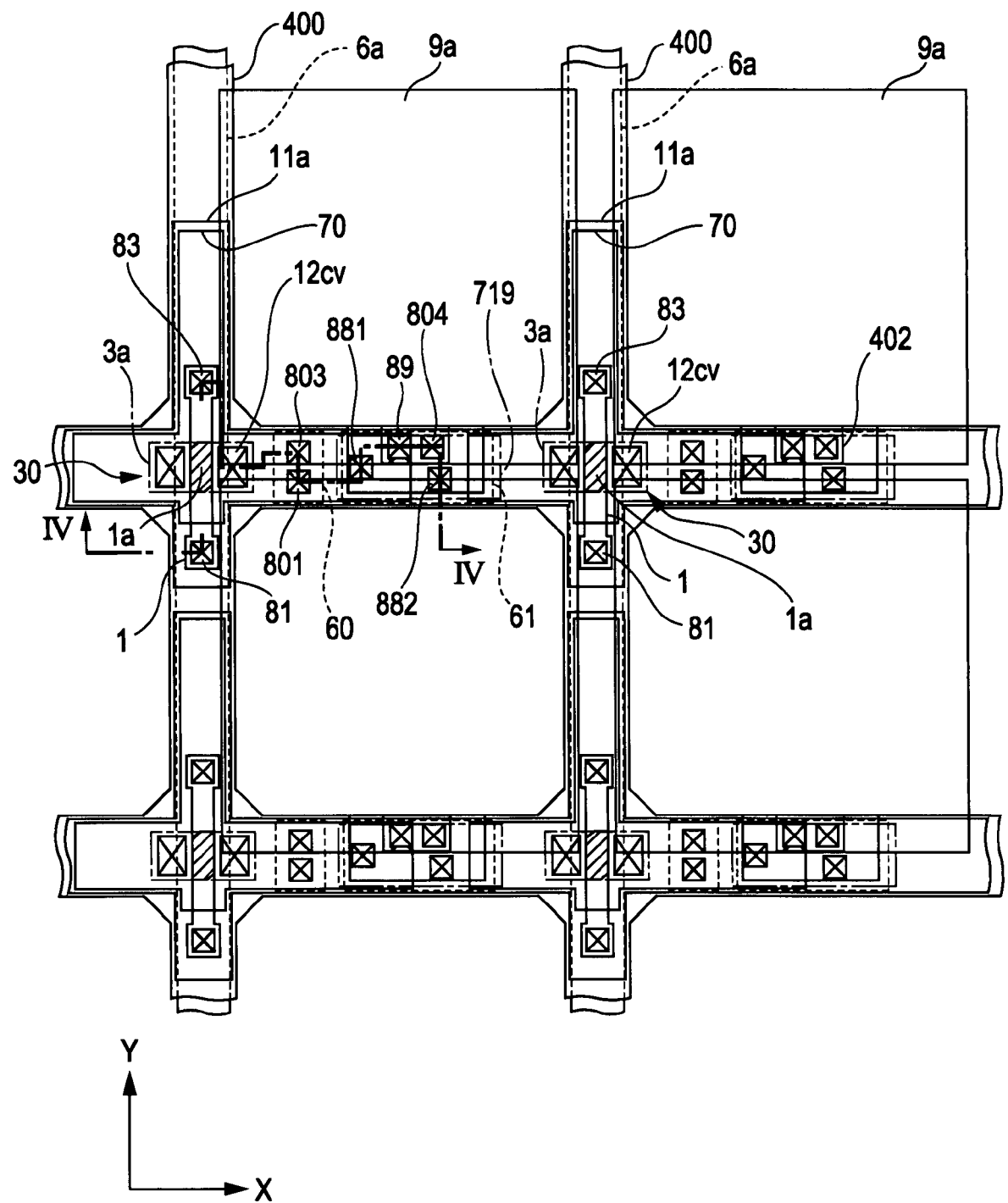
FIG. 3 is a plan view illustrating film formation patterns of layers laminated on a TFT substrate shown in FIG. 1.
Figure 4:
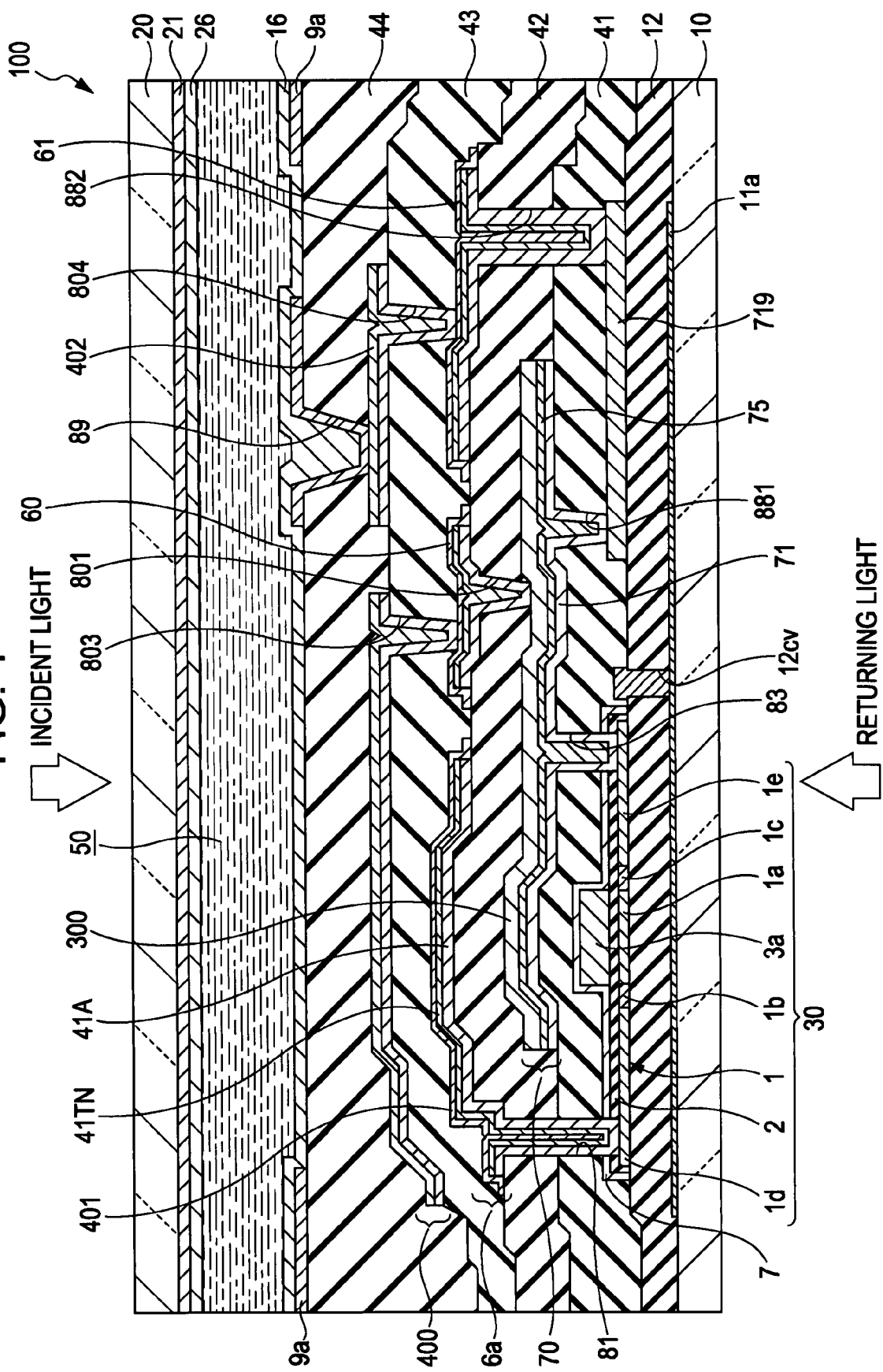
FIG. 4 is a cross-sectional view schematically illustrating the liquid crystal device shown in FIG. 1, which specifically shows a pixel at the position taken along the line IV-IV of FIG. 3.

FIG. 1 is a plan view illustrating a liquid crystal device according to a first embodiment. FIG. 2 is a cross-sectional view taken along the line II-II of FIG. 1. FIG. 3 is a plan view illustrating film formation patterns of layers laminated on a TFT substrate shown in FIG. 1. FIG. 4 is a cross-sectional view schematically illustrating the liquid crystal device shown in FIG. 1, which specifically shows a pixel at the position taken along the line IV-IV of FIG. 3.

As shown in FIGS. 1 and 2, a liquid crystal device 100 is configured to include: a TFT substrate 10 formed using, for example, a quartz substrate, a glass substrate, or a silicon substrate; a counter substrate 20 that is disposed opposite the TFT substrate 10 and is formed using, for example, a glass substrate, a quartz substrate, or a silicon substrate; and liquid crystal 50 that is formed of an electro-optic material and is interposed in an internal space between the TFT substrate 10 and the counter substrate 20. The TFT substrate 10 and the counter substrate 20 disposed opposite each other are bonded to each other by a sealant 52.

A display region 10h of the TFT substrate 10 that forms a display region 40 of the liquid crystal device 100 is provided at a surface 10f side of the TFT substrate 10 being in contact with the liquid crystal 50. In addition, as shown in FIG. 3, pixel electrodes (ITO) 9a that form pixels and are used to apply a driving voltage to the liquid crystal 50 together with a counter electrode 21, which will be described later, are arrayed in a matrix in the display region 10h.

Furthermore, the counter electrode (ITO) 21 that is used to apply a driving voltage to the liquid crystal 50 together with the pixel electrodes 9a is provided on the entire surface 20f of the counter substrate 20 being in contact with the liquid crystal 50. A display region 20h of the counter substrate 20 that forms the display region 40 of the liquid crystal device 100 is provided at a surface of the counter electrode 21 being in contact with the liquid crystal 50 so as to be opposite to the display region 10h of the TFT substrate 10.

An alignment film 16 which has been subjected to rubbing processing is provided on the pixel electrodes 9a of the TFT substrate 10, and an alignment film 26 which has been subjected to rubbing processing is provided on the counter electrode 21 formed on the entire surface of the counter substrate 20. Each of the alignment films 16 and 26 is formed using a transparent organic film, such as a polyimide film.

Furthermore, as shown in FIG. 3, in the display region 10h of the TFT substrate 10, a plurality of scanning lines 11a and a plurality of data lines 6a are disposed to cross each other and the pixel electrodes 9a are arrayed in a matrix in regions divided by the scanning lines 11a and the data lines 6a.

In addition, as shown in FIG. 3, a thin film transistor (hereinafter, referred to as a TFT) 30 that is a switching element is provided corresponding to each of the intersections between the scanning lines 11a and the data lines 6a, and the pixel electrode 9a is connected to each TFT 30.

The TFT 30 is turned on by an ON signal of the scanning line 11a. As a result, an image signal supplied to the data line 6a is supplied to the pixel electrode 9a. A voltage between the pixel electrode 9a and the counter electrode 21 provided on the counter substrate 20 is applied to the liquid crystal 50.

Furthermore, as shown in FIG. 3, a storage capacitor 70 is provided in parallel with the pixel electrode 9a. A holding time of a voltage applied to the liquid crystal 50 is increased due to the storage capacitor 70. For example, the voltage applied to the liquid crystal 50 is retained by the storage capacitor 70 for a period of time that is three orders of magnitude longer than a period for which an image signal is supplied to the pixel electrode 9a.

The counter substrate 20 is provided with a light shielding layer 53 serving as a frame that defines the display region 40 by defining and dividing outer peripheries of the display region 10h of the TFT substrate 10 and the display region 20h of the counter substrate 20 in a pixel region.

In the case when the liquid crystal 50 is injected into a space between the TFT substrate 10 and the counter substrate 20 using a known liquid crystal injection method, the sealant 52 is applied such that the sealant 52 is not present in a part of one side of the sealant 52. In addition, in the case when the liquid crystal 50 is injected into a space between the TFT substrate 10 and the counter substrate 20 using a known liquid crystal dropping method, the sealant 52 is applied continuously around the periphery without lacking in the sealant 52 in the middle.

A part where the sealant 52 is not present forms a liquid crystal inlet 108 that is used to inject the liquid crystal 50 between the TFT substrate 10 and the counter substrate 20 bonded to each other. The liquid crystal inlet 108 is sealed with a sealant 109 after injection of liquid crystal. In the case when the liquid crystal 50 is dropped using the liquid crystal dropping method, the liquid crystal inlet 108 and the sealant 109 are not needed.

A data line driving circuit 101, which is a driver that drives data lines (not shown) of the TFT substrate 10 by supplying image signals to the data lines at predetermined timing, and an external connection terminal 102 used for connection with an external circuit are provided along a side of the TFT substrate 10 in a region outside the sealant 52.

Scanning line driving circuits 103 and 104, which are drivers that drives gate electrodes 3a by supplying scanning signals to the scanning lines 11a and the gate electrodes 3a of the TFT substrate 10 at predetermined timing, are provided along two sides adjacent to the side of the TFT substrate 10. The scanning line driving circuits 103 and 104 are formed on the TFT substrate 10 facing the light shielding layer 53 located inward from the sealant 52.

Furthermore, wiring lines 105 serving to connect the data line driving circuit 101, the scanning line driving circuit 103 and 104, the external connection terminal 102, and a vertical conduction terminal 107 with each other are provided on the TFT substrate 10 opposite to three sides of the light shielding layer 53.

The vertical conduction terminals 107 are formed at four places of the TFT substrates 10 located at corners of the sealant 52. Both the TFT substrate 10 and the counter substrate 20 are provided with vertical conduction materials 106 whose lower ends are in contact with the vertical conduction terminals 107 and upper ends are in contact with the counter electrode 21, such that the TFT substrate 10 and the counter substrate 20 are electrically conducted by means of the vertical conduction materials 106.

In addition, as shown in FIG. 4, various kinds of components including the TFTs 30 and the pixel electrodes 9a are configured to have laminated structures on a surface of the TFT substrate 10, such as a quartz substrate, a glass substrate, and a silicon substrate, before forming various kinds of thin films. Since the laminated structure and functions of laminated layers are known in the related art, the laminated structure and the functions of laminated layers will be roughly described.

The laminated structure is configured to include a first layer including the scanning line 11a, a second layer including the TFTs 30 having the gate electrodes 3a and the like, a third layer including the storage capacitors 70, a fourth layer including the data lines 6a and the like, a fifth layer including a shield layer 400 and the like, and a sixth layer including the pixel electrodes 9a, the alignment film 16, and the like in this order from below. In addition, an interlayer insulating layer, which will be described later, is provided between the layers in order to prevent the above-described components from being short-circuited.

In the first layer, for example, the scanning lines 11a made of a tungsten silicide are patterned and formed to have a stripe shape in the X direction as a planar shape, as shown in FIG. 3. In addition, as shown in FIG. 3, parts of the scanning lines 11a are patterned and formed to extend in the direction in which the data lines 6a are formed in a stripe shape in plan view, that is, in the Y direction.

In addition, the scanning line 11a has a light shielding function that blocks light from being incident on the TFT 30 from below. Thus, the scanning lines 11a are patterned and formed to cover the TFTs 30 in the X direction and partially in the Y direction, specifically, semiconductor layers 1 of the TFTs 30 to be described later, more specifically, channel regions 1a of the TFTs 30 in plan view.

A base insulating layer 12 formed of a silicon nitride film, a silicon oxide film, or the like is formed on the scanning lines 11a by using an atmospheric pressure or low pressure CVD (chemical vapor deposition) method, for example.

The TFTs 30 including the gate electrodes 3a are provided in the second layer. The TFT 30 has a lightly doped drain (LDD) structure. For example, the TFT 30 is configured to include as main components: the semiconductor layer 1 formed by using a crystallized silicon film, such as a polysilicon film; the gate electrode 3a; and a gate insulating layer 2 that covers the semiconductor layer 1 in plan view in order to insulate the gate electrode 3a and the semiconductor layer 1 from each other. Although LDD stands for "lightly doped drain," one skilled in the art would understand that this term encompasses lightly doped source regions as well.

Furthermore, the gate insulating layer 2 is formed using a silicon oxide film, for example. Furthermore, the gate insulating layer 2 may be formed to have a multi-layered structure. In addition, the gate electrode 3a is provided on the gate insulating layer 2 so as to be opposite to the channel region 1a, which will be described later, and cover the channel region 1a in plan view.

The semiconductor layer 1 includes: the channel region 1a where a channel is formed by an electric field applied from the gate electrode 3a; a low-concentration source region 1b that forms an LDD region in a source region; a low-concentration drain region 1c that forms an LDD region in a drain region; a high-concentration source region 1d that forms a source region; and a high-concentration drain region 1e that forms a drain region. In addition, a relay electrode 719 is formed in the second layer as the same layer as the gate electrode 3a described above. In addition, a light-shielding insulating layer 7 is formed on the gate electrode 3a and the gate insulating layer 2 so as to cover the gate insulating layer 2 in plan view. In addition, the gate insulating layer 2 and the light-shielding insulating layer 7 are not shown in FIG. 3.

Figure 13:
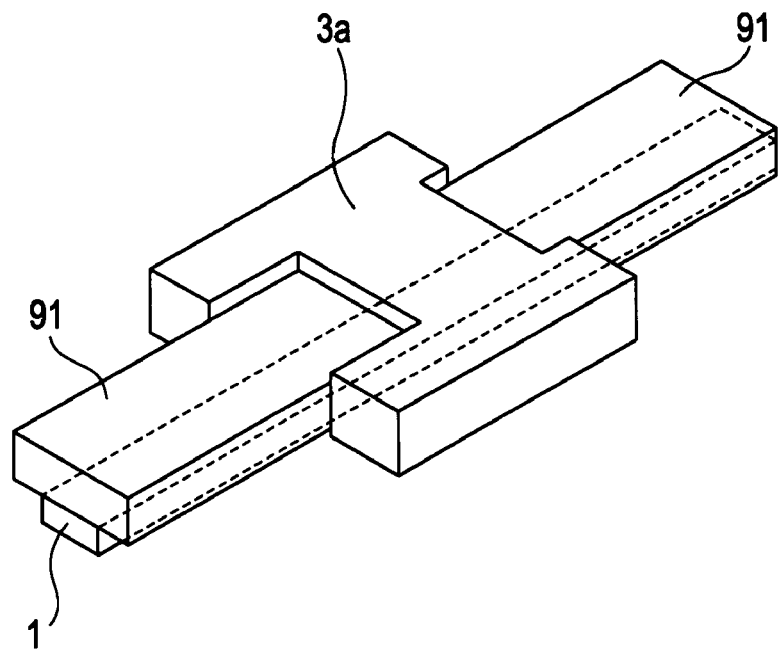
FIG. 13 is a perspective view illustrating a portion, in which a light-shielding insulating layer is formed, in an electro-optical device according to a fourth embodiment of the invention.

In the base insulating layer 12, a groove (contact hole) 12cv having a width equal to the channel length of the semiconductor layer 1 extending along the data line 6a is formed on both sides of the semiconductor layer 1 in plan view, as shown in FIG. 13. Due to the contact hole 12cv, the scanning line 11a and the gate electrode 3a located at the same line have the same electric potential.

The storage capacitor 70 that is a capacitive portion is provided in the third layer. The storage capacitor 70 is formed by disposing a lower electrode 71, which is connected to the pixel electrode 9a and a high-concentration drain region 1e of the TFT 30, and a capacitive electrode 300 so as to be opposite to each other with a dielectric film 75 serving as capacitance interposed therebetween. In addition, as shown in FIG. 3, the storage capacitor 70 blocks light from being incident on the channel region 1a since the lower electrode 71 and the capacitive electrode 300 cover the semiconductor layer 1, specifically, the channel region 1a in plan view.

On the TFT 30 or the gate electrode 3a and the relay electrode 719 and below the storage capacitor 70, a first interlayer insulating layer 41 is formed using a silicon nitride film or a silicon oxide film, for example.

A contact hole 81 provided to electrically connect the data line 6a and the high-concentration source region 1d of the TFT 30 with each other is opened in the first interlayer insulating layer 41 while penetrating a second interlayer insulating layer 42.

Furthermore, a contact hole 83 provided to electrically connect the high-concentration drain region 1e of the TFT 30 and the lower electrode 71 that forms the storage capacitor 70 with each other is opened in the first interlayer insulating layer 41.

Furthermore, a contact hole 881 provided to electrically connect the lower electrode 71 and the relay electrode 719 with each other is opened in the first interlayer insulating layer 41. Furthermore, a contact hole 882 provided to electrically connect the relay electrode 719 and a second relay layer 61 with each other is opened in the first interlayer insulating layer 41 while penetrating the second interlayer insulating layer 42.

The data line 6a is provided in the fourth layer. The data line 6a is formed as a layer having a three-layered structure including an aluminum layer 41A, a titanium nitride layer 41TN, and a silicon nitride layer 401 in this order from below. In addition, as shown in FIG. 3, the data line 6a also blocks light from being incident on the channel region 1a by covering the semiconductor layer 1, specifically, the channel region 1a in plan view.

Moreover, in the fourth layer, a relay layer 60 for a shield layer and a second relay layer 61 are formed as the same layer as the data line 6a. Furthermore, a contact hole 801 provided to electrically connect the relay layer 60 for a shield layer and the capacitive electrode 300 with each other is opened in the second interlayer insulating layer 42.

The shield layer 400 is formed in the fifth layer. In addition, as shown in FIG. 3, the shield layer 400 also blocks light from being incident on the channel region 1a by covering the semiconductor layer 1, specifically, the channel region 1a in plan view. In addition, a third relay electrode 402 serving as a relay layer is formed in the fifth layer as the same layer as the shield layer 400.

A contact hole 803 provided to electrically connect the shield layer 400 and the relay layer 60 for a shield layer with each other and a contact hole 804 provided to electrically connect the third relay electrode 402 and the second relay layer 61 with each other are opened in a third interlayer insulating layer 43.

As described above, in the sixth layer, the pixel electrodes 9a are formed in a matrix and the alignment film 16 is formed on the pixel electrodes 9a. Furthermore, a fourth interlayer insulating layer 44 is formed below the pixel electrodes 9a. In addition, a contact hole 89 provided to electrically connect the pixel electrode 9a and the third relay electrode 402 with each other is formed in the fourth interlayer insulating layer 44.

In addition, the configuration of the liquid crystal device described above is not limited to that according to the embodiment, but various kinds of embodiments may be considered.

Figure 5:
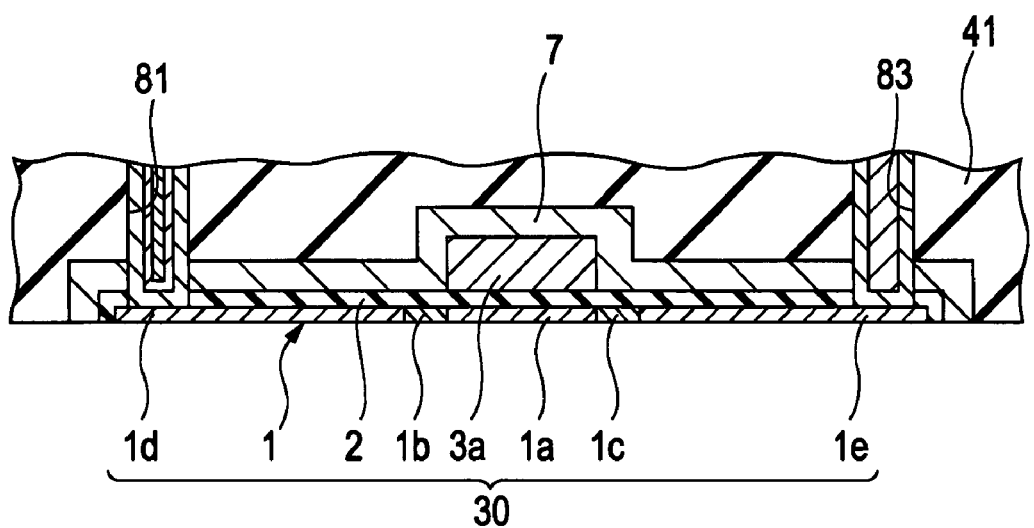
FIG. 5 is a partially sectional view illustrating an enlarged portion, in which a light-shielding insulating layer is formed, in the liquid crystal device shown in FIG. 4.
Figure 6:
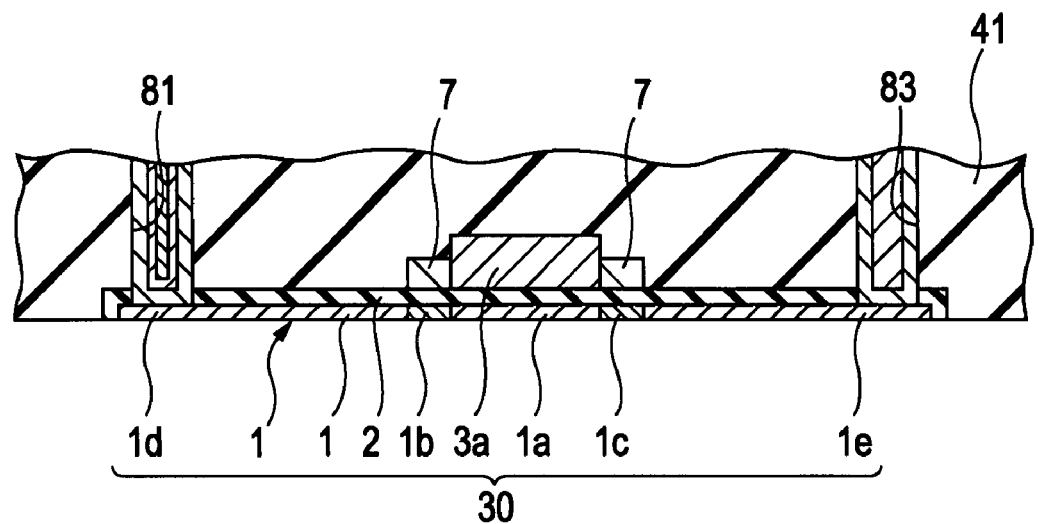
FIG. 6 is a partially sectional view illustrating a modified example in which a light-shielding insulating layer is formed only on an LDD region of a semiconductor layer.

Next, the light-shielding insulating layer 7 laminated on the gate electrode 3a and the gate insulating layer 2 will be described with reference to FIGS. 5 and 6. FIG. 5 is a partially sectional view illustrating an enlarged portion, in which a light-shielding insulating layer is formed, in the liquid crystal device shown in FIG. 4. FIG. 6 is a partially sectional view illustrating a modified example in which a light-shielding insulating layer is formed only on an LDD region of a semiconductor layer.

As shown in FIG. 5, the light-shielding insulating layer 7 is laminated in the island shape on the gate electrode 3a and the gate insulating layer 2 adjacent to the semiconductor layer 1 so as to cover the entire surface of the semiconductor layer 1 in plan view. Alternatively, as shown in FIG. 6, the light-shielding insulating layer 7 may be formed in the island shape on the gate insulating layer 2 adjacent to the semiconductor layer 1 so as to cover at least a part of the semiconductor layer 1, specifically, at least the low-concentration source region 1b and the low-concentration drain region 1c that form an LDD region in plan view.

In the case when the light-shielding insulating layer 7 covers the entire semiconductor layer 1 in plan view, the contact holes 81 and 83 described above are also formed in the light-shielding insulating layer 7.

The light-shielding insulating layer 7 is formed of a material having a lower transmittance than a silicon oxide film, which is used to form the interlayer insulating layers 12 and 41 to 44 and has a transmittance of about 90%. For example, the light-shielding insulating layer 7 is formed of a hafnium oxide ($HFO_2$) having a transmittance of about 80%, a zirconium oxide (ZrO) having a transmittance of about 70%, or the like.

In addition, high dielectric constant materials used to form the light-shielding insulating layer 7 are not limited to the hafnium oxide ($HFO_2$) or the zirconium oxide (ZrO), as long as the materials have lower light transmittances than a silicon oxide film used to form the gate insulating layer 2.

Since the light-shielding insulating layer 7 is provided on an upper layer adjacent to the semiconductor layer 1 so as to cover at least a part of the semiconductor layer 1, specifically, to cover at least the low-concentration source region 1b and the low-concentration drain region 1c in plan view, it is possible to block light from being incident on the channel region 1a of the semiconductor layer 1 of the TFT 30 from an upper side of the semiconductor layer, which cannot be blocked by the lower electrode 71 and the capacitive electrode 300 of the storage capacitor 70 that also serves as a light shielding layer, the data lines 6a, and the shield layer 400. This makes it possible to prevent the TFT 30 from malfunctioning, prevent display unevenness, crosstalk, and flickering resulting from an off-leakage current from occurring, and prevent a display contrast from decreasing, all of which occur when light is incident on the channel region 1a.

Next, a method of manufacturing the liquid crystal device according to the present embodiment will be described with reference to FIGS. 7A to 7E. Since the following method of manufacturing the liquid crystal device is already known except for processes until the light-shielding insulating layer 7 is formed, an explanation thereof will be omitted.

FIG. 7A to FIG. 7E are process views illustrating processes until a first interlayer insulating layer is formed in a method of manufacturing a TFT substrate.

Figure 7A:
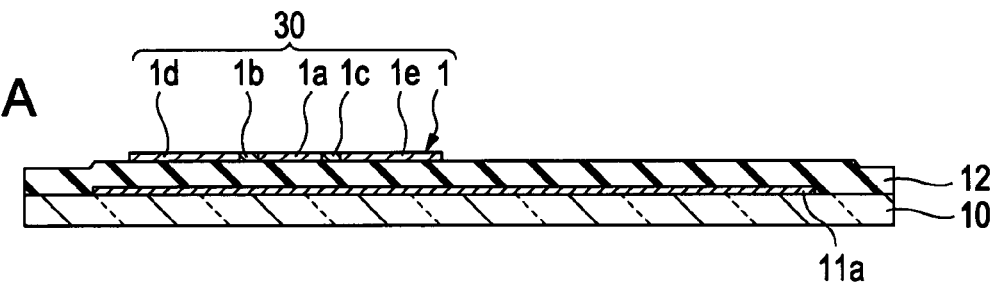
FIG. 7A is a process view illustrating a process until a first layer is laminated and then a second layer is laminated in a method of manufacturing a TFT substrate.

First, as shown in FIG. 7A, the TFT substrate 10, such as a quartz substrate, a glass substrate, and a silicon substrate, is prepared.

Subsequently, the scanning lines 11a having a stripe shape as a planar shape are patterned and formed in a predetermined shape on the TFT substrate 10 prepared in such way. In this case, the scanning lines 11a are patterned and formed in a region where the entire semiconductor layer 1, which is to be formed later, is covered in plan view.

Then, the base insulating layer 12 is formed on the scanning lines 11a using, for example, a silicon oxide film and a silicon nitride film, such as an NSG (non-silicate glass). Then, the semiconductor layer 1 is formed. Specifically, an amorphous silicon layer is first formed on the base insulating layer 12 using a low pressure CVD method or the like. Thereafter, the semiconductor layer 1 having a predetermined pattern is formed by performing a photolithographic process and an etching process.

Figure 7B:
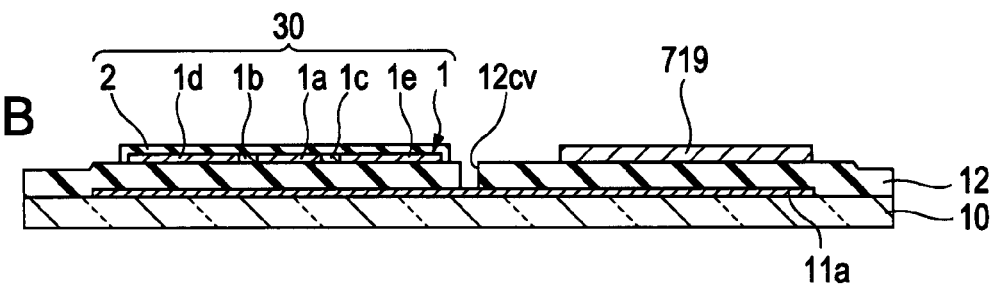
FIG. 7B is a process view illustrating the process until the first layer is laminated and then the second layer is laminated in the method of manufacturing a TFT substrate.

Then, as shown in FIG. 7B, the gate insulating layer 2 having, for example, a single silicon oxide film or a plurality of silicon oxide films is formed on the semiconductor layer 1. Then, the contact hole 12cv that passes through the base insulating layer 12 to reach the scanning line 11a is formed by means of dry etching and the like.

Figure 7C:
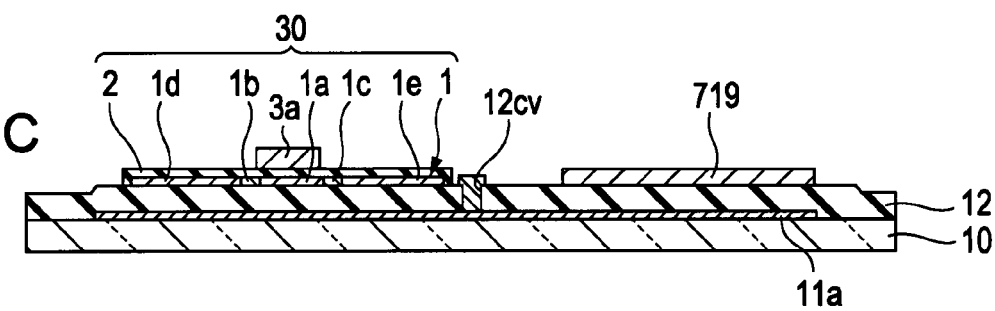
FIG. 7C is a process view illustrating the process until the first layer is laminated and then the second layer is laminated in the method of manufacturing a TFT substrate.

Subsequently, as shown in FIG. 7C, the gate electrode 3a is patterned and formed on a region of the gate insulating layer 2 facing a region of the semiconductor layer 1, which is to be the channel region 1a, so as to cover the region to be the channel region 1a in plan view.

Then, when patterning the gate electrode 3a, the relay electrode 719 is also formed simultaneously. Then, the low-concentration source region 1b, the low-concentration drain region 1c, the high-concentration source region 1d, and the high-concentration drain region 1e are formed in the semiconductor layer 1.

Figure 7D:
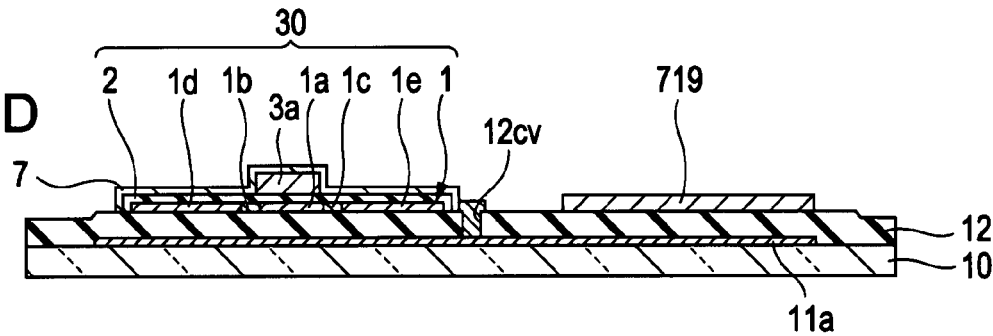
FIG. 7D is a process view illustrating the process until the first layer is laminated and then the second layer is laminated in the method of manufacturing a TFT substrate.

Subsequently, as shown in FIG. 7D, the light-shielding insulating layer 7 made of, for example, a hafnium oxide ($HfO_2$) or a zirconium oxide (ZrO) is patterned and formed on the gate insulating layer 2 so as to cover at least a part of the semiconductor layer 1, specifically, to cover at least the low-concentration source region 1b and the low-concentration drain region 1c in plan view as shown in FIG. 6 by using a CVD method or an ALD (atomic layer deposition) method, for example. Preferably, the light-shielding insulating layer 7 is formed on the gate insulating layer 2 and the gate electrode 3a so as to cover the entire semiconductor layer 1 in plan view, as shown in FIG. 5.

Figure 7E:
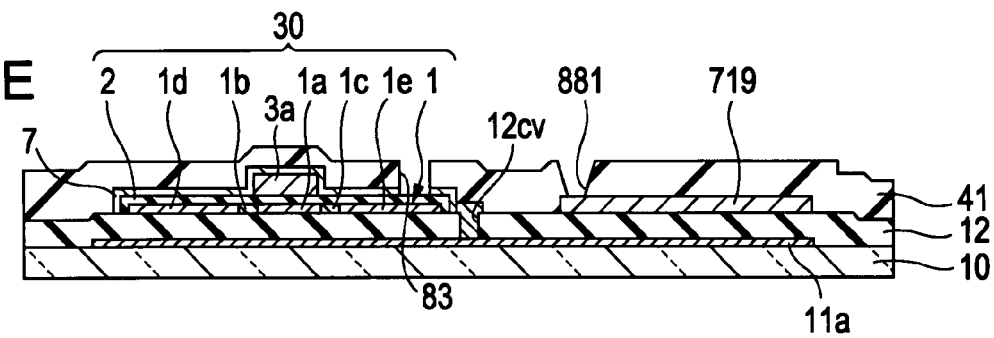
FIG. 7E is a process view illustrating the process until the first layer is laminated and then the second layer is laminated in the method of manufacturing a TFT substrate.

Thereafter, as shown in FIG. 7E, the first interlayer insulating layer 41 is formed on the light-shielding insulating layer 7, and the contact holes 83 and 881 are formed in the first interlayer insulating layer 41. Subsequent processes are known in the related art, and accordingly, an explanation thereof will be omitted.

Thus, in the present embodiment described above, the light-shielding insulating layer 7 is formed in the island shape on the gate insulating layer 2 adjacent to the semiconductor layer 1 so as to cover at least a part of the semiconductor layer 1, specifically, to cover at least the low-concentration source region 1b and the low-concentration drain region 1c in plan view as shown in FIG. 6.

According to the configuration described above, light that is incident on the channel region 1a of the semiconductor layer 1 from an upper layer side of the channel region 1a, which cannot be blocked by the lower electrode 71 and the capacitive electrode 300 of the storage capacitor 70 that also serves as a light shielding layer, the data lines 6a, and the shield layer 400, can be blocked by means of the light-shielding insulating layer 7 that is laminated on an upper layer adjacent to the semiconductor layer 1 so as to cover at least the low-concentration source region 1b and the low-concentration drain region 1c in plan view. As a result, it is possible to prevent light from being incident on the channel region 1a.

In addition, as shown in FIG. 5, the light-shielding insulating layer 7 may be formed in the island shape on the gate insulating layer 2 and the gate electrode 3a adjacent to the semiconductor layer 1 so as to cover the entire semiconductor layer 1 in plan view.

According to the configuration described above, light that is incident on the channel region 1a of the semiconductor layer 1 from an upper layer side of the channel region 1a, which cannot be blocked by the lower electrode 71 and the capacitive electrode 300 of the storage capacitor 70 that is a layer also serving as a light shielding layer, the data lines 6a, and the shield layer 400, can be blocked by means of the light-shielding insulating layer 7 that is laminated on an upper layer adjacent to the semiconductor layer 1 so as to cover the entire semiconductor layer 1 in plan view. As a result, it is possible to reliably prevent light from being incident on the channel region 1a.

Thus, it is possible to provide the liquid crystal device 100 having a configuration capable of preventing occurrence of display unevenness, crosstalk, and flickering resulting from an off-leakage current generated when light is incident on the channel region 1a or preventing a display contrast from decreasing.

Figure 8:
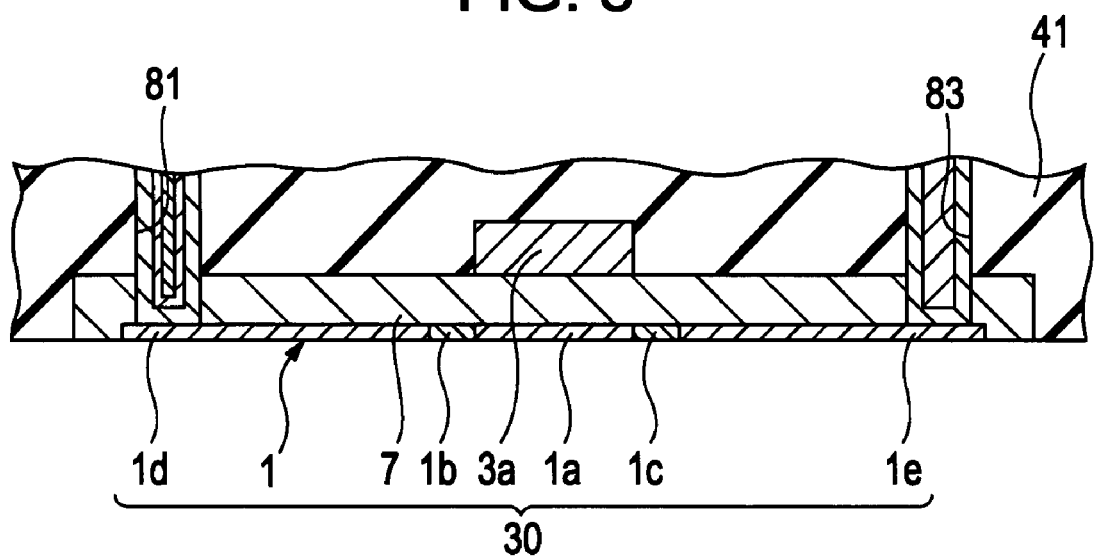
FIG. 8 is a partially sectional view illustrating a liquid crystal device in a modified example in which a light-shielding insulating layer shown in FIG. 5 also serves as a gate insulating layer.

Hereinafter, a modified example will be described with reference to FIG. 8. FIG. 8 is a partially sectional view illustrating a liquid crystal device in a modified example in which the light-shielding insulating layer shown in FIG. 5 also serves as a gate insulating layer.

In the present embodiment, the light-shielding insulating layer 7 is formed on the gate insulating layer 2 so as to be adjacent to the semiconductor layer 1. However, the invention is not limited thereto. For example, as shown in FIG. 8, the gate insulating layer 2 may also be formed by using the light-shielding insulating layer 7. That is, the light-shielding insulating layer 7 may be formed immediately above the semiconductor layer 1 so as to be in contact with the semiconductor layer 1.

Since the light-shielding insulating layer 7 can electrically insulate the gate electrodes 3a from the channel region 1a, the light-shielding insulating layer 7 can be formed instead of the gate insulating layer 2.

According to such configuration, since the light-shielding insulating layer 7 can be formed immediately above the channel region 1a of the semiconductor layer 1, that is, at the position closest to the semiconductor layer 1, the light that is incident on the channel region 1a from the upper layer side of the semiconductor layer 1 can be blocked by the light-shielding insulating layer 7 more reliably than in the present embodiment described above.

Figure 9:
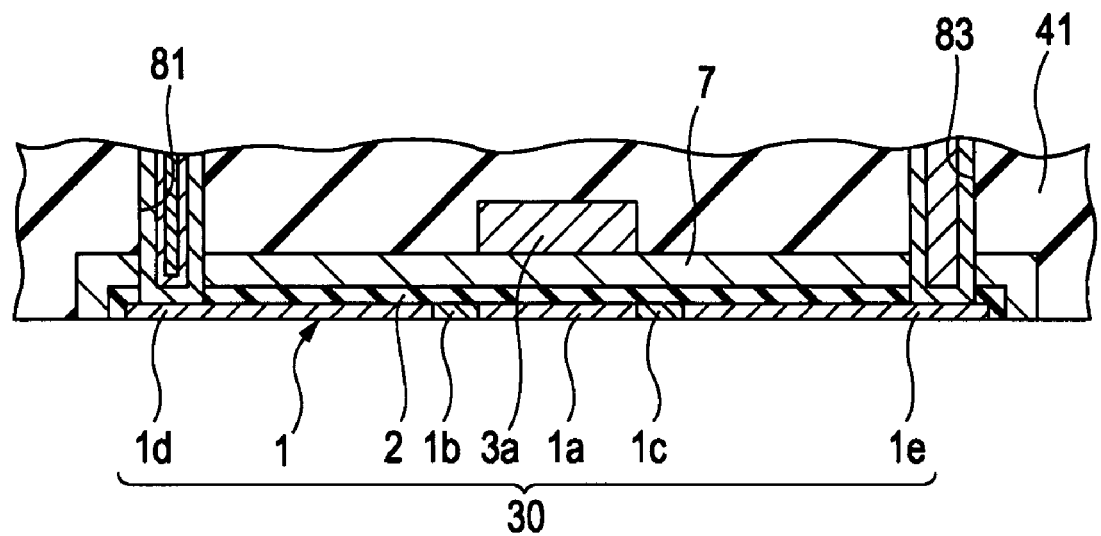
FIG. 9 is a partially sectional view illustrating a liquid crystal device in a modified example in which a gate insulating layer is formed between a semiconductor layer and the light-shielding insulating layer shown in FIG. 8.

In addition, another modified example will now be described with reference to FIG. 9. FIG. 9 is a partially sectional view illustrating a liquid crystal device in a modified example in which a gate insulating layer is formed between the semiconductor layer and the light-shielding insulating layer shown in FIG. 8.

As shown in FIG. 9, the gate insulating layer 2 may be formed between the light-shielding insulating layer 7 and the semiconductor layer 1. In other words, the gate electrode 3a may be formed in a region opposite to the channel region 1a on the light-shielding insulating layer 7 so as to cover the channel region 1a in plan view. Even in this configuration, the same effects as in the present embodiment described above can be acquired.

Second Embodiment

Figure 10:
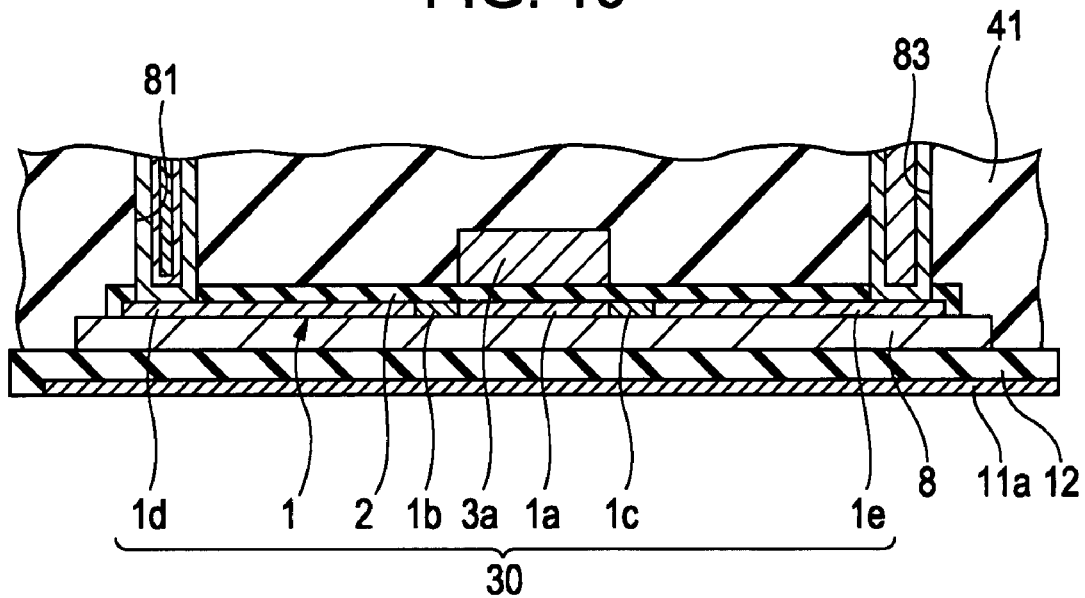
FIG. 10 is a partially sectional view illustrating an enlarged portion, in which a light-shielding insulating layer is formed, in a liquid crystal device according to a second embodiment.

FIG. 10 is a partially sectional view illustrating an enlarged portion, in which a light-shielding insulating layer is formed, in a liquid crystal device according to a second embodiment.

The configuration of the liquid crystal device according to the second embodiment is different from that of the liquid crystal device according to the first embodiment in that light incident on a channel region from a lower layer side of a semiconductor layer is blocked. Therefore, only different points from the first embodiment will be herein described. In addition, the same components as in the liquid crystal device 100 according to the first embodiment are denoted by the same reference numerals, and an explanation thereof will be omitted.

As shown in FIG. 10, in the liquid crystal device according to the present embodiment, a light-shielding insulating layer 8 is formed in the island shape on a base insulating layer 12 so as to cover a semiconductor layer 1 in plan view from a layer that is in contact with and provided immediately below the semiconductor layer 1. In addition, although not shown, the light-shielding insulating layer 8 may also be formed in the island shape so as to cover the semiconductor layer 1 in plan view from a lower layer adjacent to the semiconductor layer 1.

Alternatively, although not shown, the light-shielding insulating layer 8 may be formed in the island shape so as to cover at least a part of the semiconductor layer 1, specifically, at least a low-concentration source region 1b and a low-concentration drain region 1c, in the same manner as the light-shielding insulating layer 7 according to the first embodiment.

Furthermore, since a material used to form the light-shielding insulating layer 8 in the present embodiment is the same as a material used to form the light-shielding insulating layer 7 in the first embodiment, an explanation thereof will be omitted.

Furthermore, since a process of forming the light-shielding insulating layer 8 is approximately the same as a process of forming the light-shielding insulating layer 7 in the first embodiment except that the light-shielding insulating layer 8 is formed on the base insulating layer 12, an explanation thereof will be omitted.

As described above, according to the present embodiment, light that is incident on the channel region 1a of the semiconductor layer 1 from a lower layer side of the channel region 1a, which cannot be blocked by the scanning line 11a that is a layer also serving as a light shielding layer, can be blocked due to the light-shielding insulating layer 8 laminated on a layer immediately below the semiconductor layer 1 being in contact with the semiconductor layer 1 or a layer below the semiconductor layer 1 adjacent to the semiconductor layer 1.

Thus, it is possible to prevent light from being incident on the channel region 1a. As a result, it is possible to provide a liquid crystal device 100 having a configuration capable of preventing occurrence of display unevenness, crosstalk, and flickering resulting from an off-leakage current generated when light is incident on the channel region 1a or preventing a display contrast from decreasing.

Third Embodiment

Figure 11:
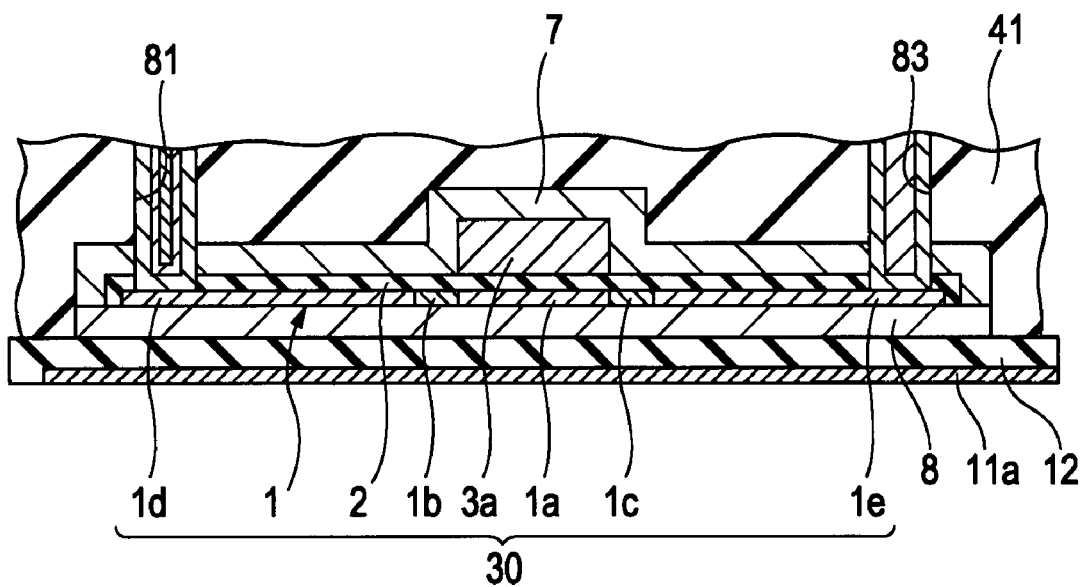
FIG. 11 is a partially sectional view illustrating an enlarged portion, in which a light-shielding insulating layer is formed, in a liquid crystal device according to a third embodiment.

FIG. 11 is a partially sectional view illustrating an enlarged portion, in which a light-shielding insulating layer is formed, in a liquid crystal device according to a third embodiment.

The configuration of the liquid crystal device according to the third embodiment is different from those of the liquid crystal devices according to the first and second embodiments described above in that light incident on a channel region from both directions of upper and lower layer sides of a semiconductor layer is blocked. Therefore, only different points from the first and second embodiments will be herein described. In addition, the same components as in the liquid crystal device 100 according to the first embodiment and the liquid crystal device according to the second embodiment are denoted by the same reference numerals, and an explanation thereof will be omitted.

As shown in FIG. 11, in the liquid crystal device according to the present embodiment, the light-shielding insulating layer 8 described in the second embodiment is formed in the island shape on a base insulating layer 12 so as to cover a semiconductor layer 1 in plan view from a layer that is in contact with and provided immediately below the semiconductor layer 1 or a lower layer adjacent to the semiconductor layer 1.

Furthermore, the light-shielding insulating layer 7 described in the first embodiment is formed in the island shape on the gate insulating layer 2 and the gate electrode 3a so as to cover the semiconductor layer 1 in plan view from an upper layer adjacent to the semiconductor layer 1.

Furthermore, even in the present embodiment, the light-shielding insulating layers 7 and 8 may be formed in the island shape above and below the semiconductor layer 1 so as to cover at least a part of the semiconductor layer 1, specifically, at least a low-concentration source region 1b and a low-concentration drain region 1c.

In addition, since a process of forming the light-shielding insulating layers 7 and 8 is the same as processes in the first and second embodiments, an explanation thereof will be omitted.

As described above, according to the present embodiment, light that is incident on the channel region 1a from upper and lower layer sides of the channel region 1a can be blocked by the light-shielding insulating layers 7 and 8 laminated above and below the semiconductor layer 1. Accordingly, it is possible to prevent the light from being incident on the channel region 1a of the semiconductor layer 1.

As a result, it is possible to provide a liquid crystal device having a configuration capable of preventing occurrence of display unevenness, crosstalk, and flickering resulting from an off-leakage current generated when light is incident on the channel region 1a or preventing a display contrast from decreasing.

Fourth Embodiment

FIG. 13 is a perspective view illustrating a portion, in which a light-shielding insulating layer is formed, in an electro-optical device according to a fourth embodiment of the invention.

In the first embodiment described above, the light-shielding insulating layer 7 is also formed on a gate electrode as well as a semiconductor layer. In contrast, the present embodiment is different from the first embodiment in that a light-shielding insulating layer is formed on a semiconductor layer excluding a gate electrode. Therefore, only the different point will be herein described. In addition, the same components as in the first embodiment are denoted by the same reference numerals, and an explanation thereof will be omitted.

As shown in FIG. 13, in a liquid crystal device according to the present embodiment, a light-shielding insulating layer 91 is formed on a semiconductor layer (not shown). The insulating layer 91 is formed to cover the semiconductor layer 1 (refer to FIG. 5) excluding the gate electrode 3a in plan view. That is, the insulating layer 91 is obtained by removing a portion on the gate electrode 3a from the insulating layer 7 shown in FIG. 5. For example, after forming the gate electrode 3a, the insulating layer 91 can be formed by masking the semiconductor layer 1 excluding the gate electrode 3a with a resist and the like and forming an insulating layer by patterning.

As described above, according to the present embodiment, light that is incident on the channel region 1a from an upper layer side of the channel region 1a can be blocked by the light-shielding insulating layer 91 laminated above the semiconductor layer 1. Accordingly, it is possible to prevent the light from being incident on the channel region 1a of the semiconductor layer 1.

As a result, it is possible to provide a liquid crystal device having a configuration capable of preventing occurrence of display unevenness, crosstalk, and flickering resulting from an off-leakage current generated when light is incident on the channel region 1a or preventing a display contrast from decreasing.

Furthermore, in the present embodiment, the light-shielding insulating layer is not formed in a portion where the gate electrode is formed but the light-shielding insulating layer is formed on the semiconductor layer excluding the portion where the gate electrode is formed. As a result, a step difference in the portion where the gate electrode is formed can be reduced by means of the light-shielding insulating layer.

Fifth Embodiment

Figure 14:
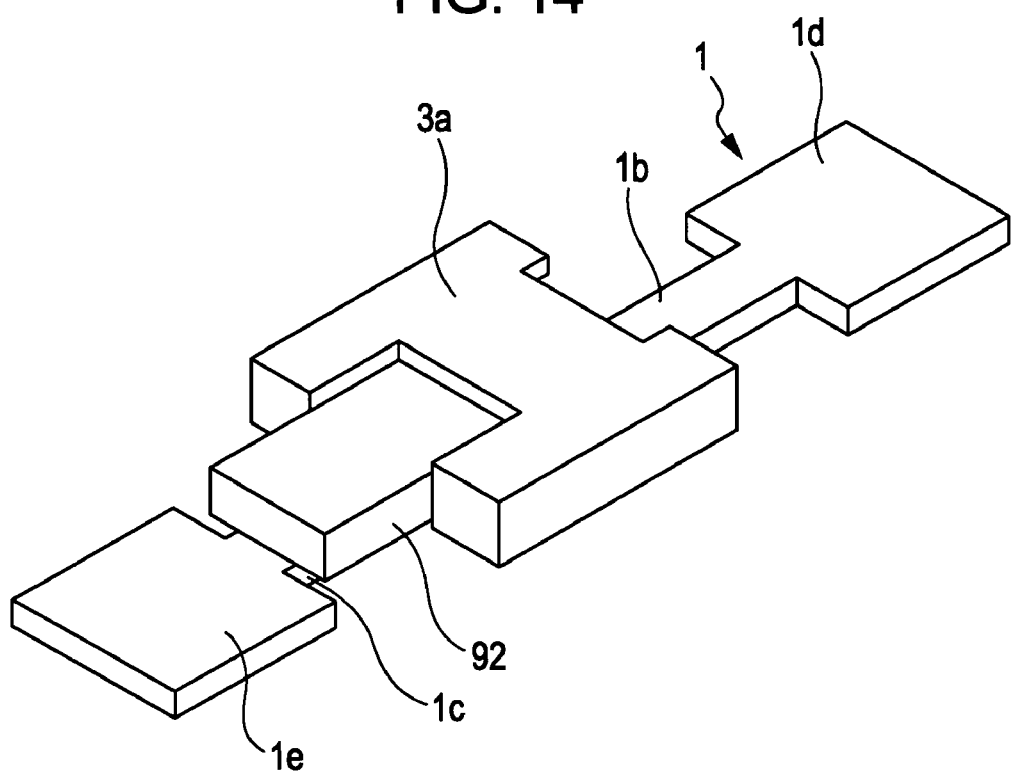
FIG. 14 is a perspective view illustrating a portion, in which a light-shielding insulating layer is formed, in an electro-optical device according to a fifth embodiment of the invention.

FIG. 14 is a perspective view illustrating a portion, in which a light-shielding insulating layer is formed, in an electro-optical device according to a fifth embodiment of the invention.

In the first embodiment described above, an example in which a light-shielding insulating layer is formed only on the LDD region (refer to FIG. 6) is shown. In contrast, the present embodiment is different from the embodiment shown in FIG. 6 in that a light-shielding insulating layer is formed on a semiconductor layer corresponding to only an LDD region of a drain region, to which the pixel electrode 9a is electrically connected, of the low-concentration source region 1b that forms an LDD region in a source region and the low-concentration drain region 1c that forms an LDD region in a drain region. Therefore, only the different point will be herein described. In addition, the same components as in the first embodiment are denoted by the same reference numerals, and an explanation thereof will be omitted.

As shown in FIG. 14, in a liquid crystal device according to the present embodiment, a light-shielding insulating layer 92 is formed on a semiconductor layer. The insulating layer 92 is formed only on the low-concentration drain region 1c of the drain region to which the pixel electrode 9a is electrically connected, thereby covering an LDD region of the drain region in plan view. That is, the insulating layer 92 is formed by removing a portion on the low-concentration source region 1b from the insulating layer 7 shown in FIG. 6. A side surface of the insulating layer 92 abuts on a side surface of the pixel electrode 9a. For example, after forming the gate electrode 3a, the insulating layer 92 can be formed by masking a portion excluding the low-concentration drain region 1c and forming an insulating layer by patterning.

Thus, according to the present embodiment, light that is incident from an upper layer side of an LDD region of the drain region electrically connected to a pixel electrode can be blocked by the light-shielding insulating layer 92. Accordingly, it is possible to prevent the light from being incident on the LDD region at the pixel electrode side.

As a result, it is possible to provide a liquid crystal device having a configuration capable of preventing occurrence of display unevenness, crosstalk, and flickering resulting from an off-leakage current generated when light is incident on the LDD region or preventing a display contrast from decreasing.

Here, a drain region electrically connected to the pixel electrode is more easily affected by light than a source region of a semiconductor layer. Therefore, it is possible to effectively avoid an influence due to an optical leakage by covering the LDD region of the drain region electrically connected to the pixel electrode with the light-shielding insulating layer, in the same manner as in the present embodiment. In addition, irrespective of drain region and source regions, it is preferable to form a light-shielding insulating layer so as to cover an LDD region of a drain or source region to which a pixel electrode is electrically connected to. It should be noted that the light-shielding insulating layer could be provided directly below the LDD region (rather than above as shown in FIG. 14), so as to be in direct contact with the semiconductor layer.

In addition, as described above, contact holes are provided on the source and drain regions for the purpose of electrical connection between the source and drain regions. In the first embodiment, it is preferable to remove a light-shielding insulating layer before forming the contact holes if a selection ratio between the light-shielding insulating layer and an interlayer insulating layer is taken into consideration. However, the present embodiment is advantageous in that processing is easy because the light-shielding insulating layer is not provided in a contact region.

In addition, it is needless to say that a liquid crystal device is not limited to the above-described illustrated examples but various changes and modifications can be made without departing from the scope or sprit of the invention. For example, although the above liquid crystal devices have been described using active-matrix-type liquid crystal display modules, in which active elements such as TFTs (thin film transistors) are used, as examples, the invention is not limited thereto but it is also possible to use active-matrix-type liquid crystal display modules in which active elements such as TFDs (thin film diodes) are used.

Moreover, in the present embodiment, the electro-optical device has been described using the liquid crystal device as an example. However, the invention is not limited thereto. For example, the invention may also be applied to various kinds of electro-optical devices, such as an electroluminescent device, particularly, an organic electroluminescent device or an inorganic electroluminescent device, a plasma display device, an FED (field emission display) device, an SED (surface-conduction electron-emitter display) device, an LED (light-emitting diode) display device, an electrophoretic display device, and a device using a small television in which a thin cathode ray tube or a liquid crystal shutter is used.

In addition, the electro-optical device may be a display device in which elements are formed on a semiconductor substrate, for example, an LCOS (liquid crystal on silicon). In the LCOS, a single-crystal silicon substrate is used as an element substrate and transistors serving as switching elements, which are used for pixels or peripheral circuits, are formed on the silicon substrate. In addition, a reflective pixel electrode is used in a pixel and elements of pixel are formed below the pixel electrode.

In addition, the electro-optical device may be, for example, an IPS (in-plane switching) display device in which a pair of electrodes are formed in the same layer on one side of a substrate or an FFS (fringe field switching) display device in which a pair of electrodes are formed with an insulating layer interposed therebetween on one side of a substrate.

Figure 12:
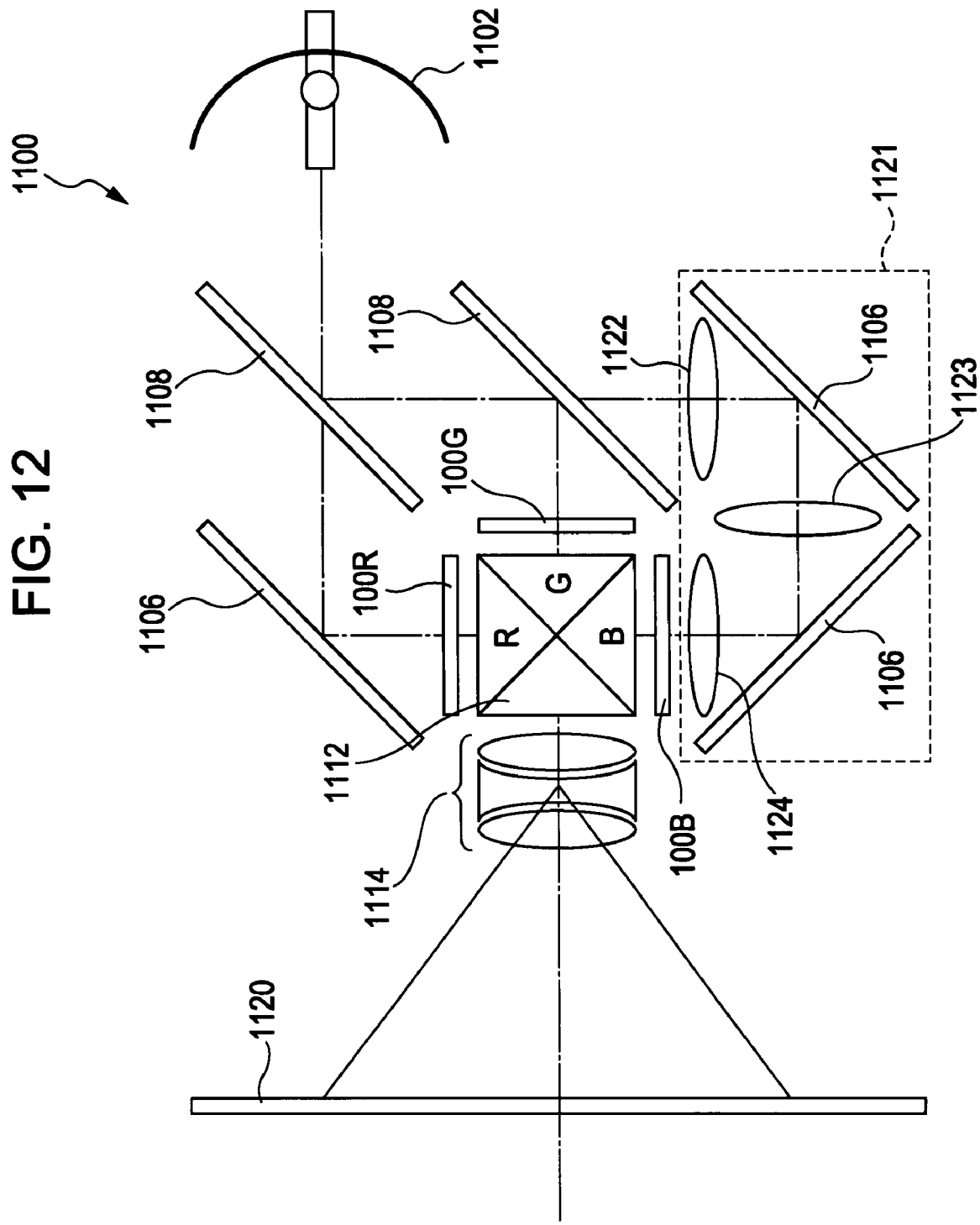
FIG. 12 is a view illustrating the configuration of a projector in which three liquid crystal devices shown in FIG. 1 are disposed.

Further, as an electronic apparatus in which the liquid crystal device according to the embodiment of the invention is used, there is a projection-type display device, specifically, a projector. FIG. 12 is a view illustrating the configuration of a projector in which three liquid crystal devices shown in FIG. 1 are disposed.

As shown in FIG. 12, the liquid crystal device 100, for example, three liquid crystal devices 100R, 100G, and 100B are disposed as light values corresponding to RGB colors in a projector 1100.

In the projector 1100, when projection light is emitted from a lamp unit 1102 that is a white light source, such as a metal halide lamp, the projection light is divided into light components R, G, and B corresponding to three primary colors of RGB by means of three mirrors 1106 and two dichroic mirrors 1108 and the divided light components R, G, and B are respectively guided to the light valves 100R, 100G, and 100B corresponding to the respective colors.

In particular, the B light is guided through a relay lens system 1121 configured to include an incidence lens 1122, a relay lens 1123, and an emission lens 1124 in order to prevent an optical loss occurring due to a long optical path.

Then, the light components corresponding to the three primary colors, which are modulated by the light valves 100R, 100G, and 100B, are recombined by a dichroic prism 1112 and are then projected as a color image onto a screen 1120 through a projection lens 1114.

What is claimed is:

1. An electro-optical device comprising:
   a plurality of thin films laminated on a substrate;
   a transistor formed by a part of the plurality of laminated thin films including a semiconductor layer, the semiconductor layer comprising a channel region, a source region, a drain region, a first LDD region between the channel region and the source region, and a second LDD region between the channel region and the drain region;
   a pixel electrode electrically connected to one of the source region and the drain region; and
   a light-shielding insulating layer that forms a part of the plurality of thin films, the light-shielding insulating layer being formed in an island shape that covers, in plan view, only one of the first LDD region and the second LDD region that is between the source and drain regions that is electrically connected to the pixel electrode,
   wherein the light-shielding insulating layer is laminated above the semiconductor layer in direct contact with the semiconductor layer.

2. The electro-optical device according to claim 1, wherein the light-shielding insulating layer is formed of a high dielectric constant material.

3. The electro-optical device according to claim 2, wherein the light-shielding insulating layer is formed of a hafnium oxide or a zirconium oxide.

4. The electro-optical device according to claim 2, wherein the transistor includes:
   the semiconductor layer;
   a gate insulating layer that is laminated on the semiconductor layer and is formed of a silicon oxide; and
   a gate electrode laminated on the gate insulating layer so as to be opposite to the channel region, and
   the light-shielding insulating layer is formed of a material having a lower transmittance of visible light than the silicon oxide.

5. The light-emitting device according to claim 1, wherein the light-shielding insulating layer is formed on the semiconductor layer excluding a region where a gate electrode of the transistor is formed.

* * * * *